United States Patent [19]
Denison

[11] Patent Number: 5,897,711
[45] Date of Patent: *Apr. 27, 1999

[54] METHOD AND APPARATUS FOR IMPROVING REFRACTIVE INDEX OF DIELECTRIC FILMS

[75] Inventor: Dean R. Denison, San Jose, Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/577,519

[22] Filed: Dec. 22, 1995

[51] Int. Cl.⁶ .......................... C23C 16/00; H01L 21/00
[52] U.S. Cl. .................. 427/579; 438/788; 118/723 E
[58] Field of Search .................. 118/723 R, 723 MR, 118/723 ME, 728; 156/345; 204/298.15, 298.07, 298.33; 438/778, 787, 788, 789, 790; 427/579

[56] References Cited

U.S. PATENT DOCUMENTS

| | | | |
|---|---|---|---|
| 3,993,509 | 11/1976 | McGinty | 437/8 |
| 4,184,188 | 1/1980 | Briglia | 361/234 |
| 4,384,918 | 5/1983 | Abe | 156/345 X |
| 4,401,054 | 8/1983 | Matsuo et al. | 118/723 MR |
| 4,412,906 | 11/1983 | Sato et al. | 204/298.07 |
| 4,512,283 | 4/1985 | Bonifield et al. | 118/728 X |
| 4,614,639 | 9/1986 | Hegedus | 204/298.33 X |
| 4,902,934 | 2/1990 | Miyamura et al. | 118/728 X |
| 4,996,077 | 2/1991 | Moslehi et al. | 118/719 X |
| 5,162,633 | 11/1992 | Sonobe et al. | 156/345 X |
| 5,200,232 | 4/1993 | Tappan et al. | 118/719 X |
| 5,384,008 | 1/1995 | Sinha et al. | 118/728 X |
| 5,415,728 | 5/1995 | Hasegawa et al. | 156/345 X |
| 5,498,313 | 3/1996 | Bailey et al. | 156/345 X |
| 5,571,576 | 11/1996 | Quian et al. | 427/579 X |

*Primary Examiner*—Thi Dang
*Attorney, Agent, or Firm*—Burns, Doane, Swecker & Mathis, L.L.P.

[57] ABSTRACT

A method and an apparatus for depositing a dielectric film on a substrate in a plasma process chamber wherein the uniformity of the refractive index of the film is improved. The method involves introducing an oxygen reactant and a silicon reactant into the process chamber and generating a plasma, contacting the substrate with the plasma and depositing a $SiO_x$ film thereon. To control uniformity of the refractive index of the film, a second oxygen reactant is injected locally at a position at which it is desired to lower the refractive index. The second oxygen reactant can be $O_2$ which is injected at the periphery of the substrate. The gas injection apparatus includes a substrate support below the substrate and a deposition shield surrounding the substrate. The shield contains gas injection outlets directed toward the periphery of the substrate for supplying the $O_2$ to a region above the outer periphery of the substrate.

13 Claims, 4 Drawing Sheets

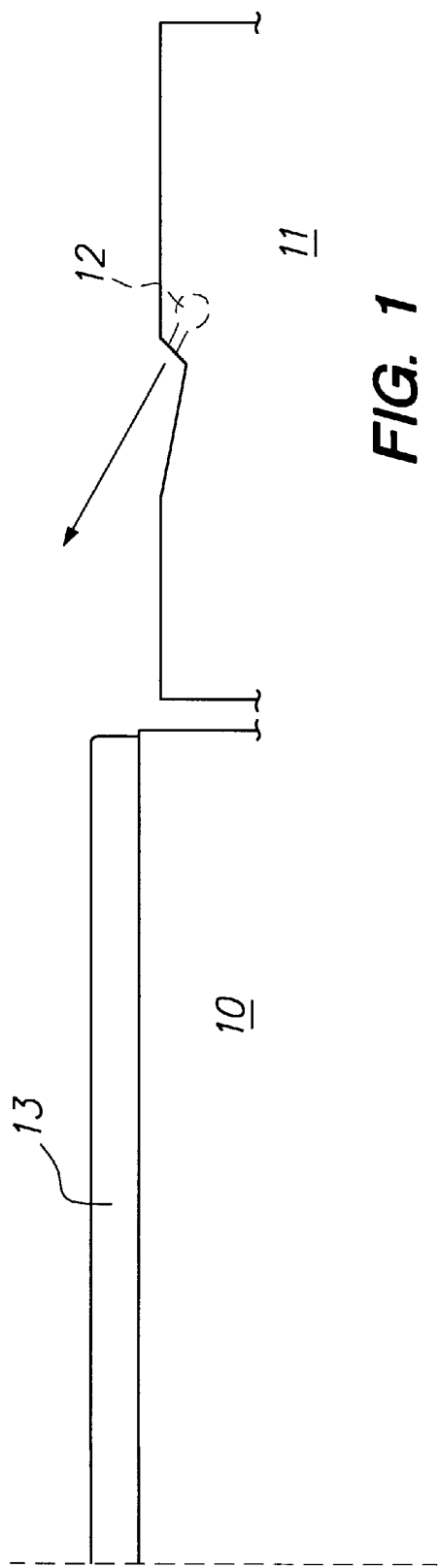
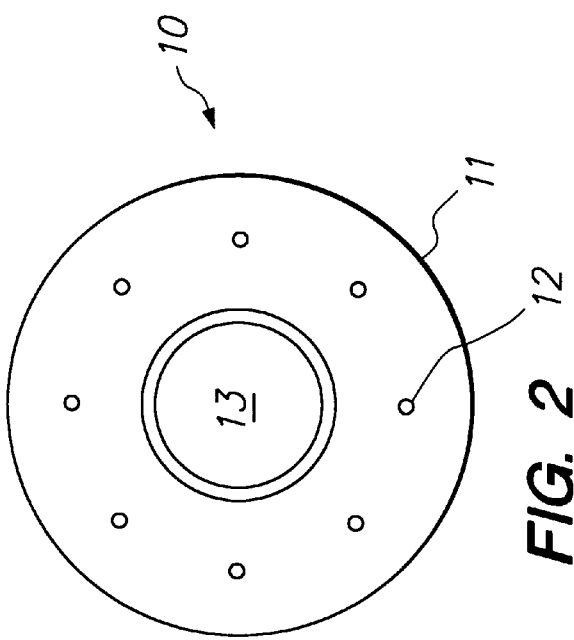

METHOD AND APPARATUS FOR IMPROVING REFRACTIVE INDEX OF DIELECTRIC FILMS

FIELD OF THE INVENTION

This invention relates to a method and an apparatus for improving the refractive index of dielectric films deposited in a reactor such as a plasma-enhanced chemical vapor deposition (CVD) system.

DESCRIPTION OF RELATED ART

CVD apparatus is conventionally used to form various thin films in a semiconductor integrated circuit. Such CVD apparatus can form thin films such as $SiO_2$, $Si_3N_4$, Si or the like with high purity and high quality. In the reaction process of forming a thin film, a reaction vessel in which semiconductor substrates are arranged can be heated to a high temperature condition of 500 to 1000° C. Raw material to be deposited can be supplied through the vessel in the form of gaseous constituents so that gaseous molecules are thermally disassociated and combined in the gas and on a surface of the substrates so as to form a thin film.

A plasma-enhanced CVD apparatus utilizes a plasma reaction to create a reaction similar to that of the above-described CVD apparatus, but at a relatively low temperature in order to form a thin film. The plasma CVD apparatus includes a process chamber consisting of a plasma generating chamber which may be separate from or part of a reaction chamber, a gas introduction system, and an exhaust system. For example, such a plasma-enhanced CVD apparatus is disclosed in U.S. Pat. No. 4,401,504. Plasma is generated in such an apparatus by a microwave discharge through electron-cyclotron resonance (ECR). A substrate table is provided in the reaction chamber, and plasma generated in the plasma formation chamber passes through a plasma extracting orifice so as to form a plasma stream in the reaction chamber. The substrate table may include a radiofrequency (RF) biasing component to apply an RF bias to the substrate and a cooling mechanism in order to prevent a rise in temperature of the substrate due to the plasma action.

A plasma apparatus using ECR for various processes such as deposition, etching and sputtering to manufacture semiconductor components is disclosed in U.S. Pat. No. 4,902,934. Such a plasma apparatus includes an electrostatic chuck (ESC) for holding a substrate (such as a silicon wafer) in good thermal contact and in a vertical orientation. The chuck can also be provided with cooling and heating capabilities. In general, such reaction chambers can be operated under vacuum conditions, and the plasma generation chamber can be enclosed by walls which are water-cooled.

Electrostatic chucking devices are disclosed in U.S. Pat. Nos. 3,993,509; 4,184,188; and 4,384,918. With such systems, a wafer substrate is typically located on a dielectric layer, and the wafer supporting surface of such electrostatic chucking arrangements can be larger or smaller than the wafer substrate supported thereon. The electrostatic voltage and RF bias are applied to an electrode buried within a dielectric layer and proximate to the wafer/substrate contact surface.

Although various techniques are available for depositing of dielectric films such as silicon dioxide, such techniques are not intended to permit control of the uniformity of the refractive index without adversely affecting other properties of such films. As such, there is a need in the art for a technique which permits uniformity of the refractive index to be controlled, especially since the trend in the industry is to deposit such films on substrates that are becoming larger.

SUMMARY OF THE INVENTION

The present invention provides a method and an apparatus for depositing a dielectric film having a substantially uniform refractive index without adversely affecting other properties of the film. In particular, according to the invention it is possible to selectively add oxygen to the plasma above the film at a location where it is desired to lower the refractive index. By selectively adding oxygen to the plasma while depositing the film, the uniformity of the resulting dielectric film refractive index can be improved without affecting the film's other properties.

According to one aspect of the present invention, an oxygen reactant and a silicon reactant are introduced into a plasma process chamber and a plasma is generated. The plasma is contacted with a substrate to deposit an $SiO_x$ film on the substrate. During the deposition, an oxygen-containing gas is injected locally into the plasma at a desired region in order to lower the refractive index of the film in that region to a desired level. The method according to the invention thus provides an $SiO_x$ film having a substantially uniform refractive index.

In a preferred embodiment, the substrate is a silicon wafer and an $SiO_2$ film is deposited on the wafer. An oxygen-containing gas such as pure $O_2$ is injected into the plasma at the periphery of the wafer through a plurality of gas jets which can be equally spaced around the silicon wafer. The $SiO_2$ film thus produced has a refractive index at all portions thereof of between about 1.46 and about 1.48.

The gas injection apparatus of the invention includes a substrate support below the substrate and a deposition shield surrounding the substrate support. The deposition shield has one or more gas injection outlets for injecting an oxygen reactant such as $O_2$ to a region above the periphery of the substrate.

In a preferred embodiment of the apparatus, the substrate support is a chuck such as an electrostatic chuck. Alternatively, the substrate support can include a clamping ring which clamps the substrate on the substrate support. The deposition shield is not integral with the substrate support. For injecting the $O_2$, the shield can include a ring of equally spaced gas jets. The jets are preferably oriented so that oxygen can be selectively injected into the plasma at the periphery of the substrate.

BRIEF DESCRIPTION OF THE DRAWINGS

The invention will now be described with reference to the accompanying drawings, in which:

FIG. 1 illustrates half of a cross-section of one embodiment of a substrate support surrounded by a deposition shield having a plurality of gas injection jets in accordance with the present invention;

FIG. 2 illustrates a top view of the apparatus illustrated in FIG. 1;

DETAILED DESCRIPTION OF THE PREFERRED EMBODIMENTS

Figure 3:
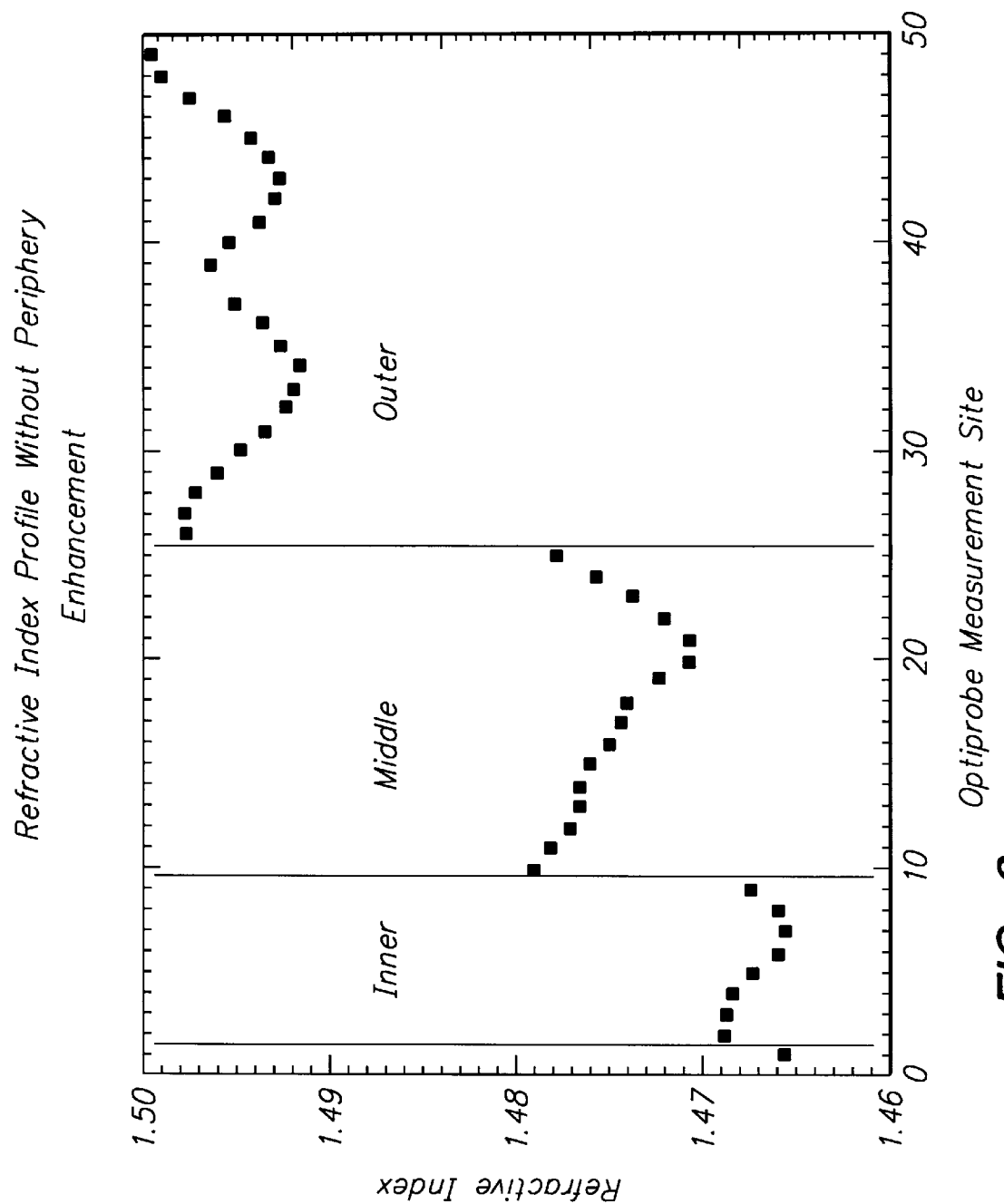
FIG. 3 illustrates the refractive index profile of a film deposited without the gas jets.

The invention relates to a method and apparatus for depositing a dielectric film on a substrate in a plasma process chamber wherein the uniformity of the refractive index of the film is improved. In particular, the refractive index uniformity is improved by selectively injecting an oxygen reactant such as $O_2$ into the plasma above a portion of the film where the refractive index is relatively high in order to lower the refractive index and match the refractive index of the remainder of the film.

In the case of $SiO_x$ films deposited by PECVD, it has been found that the refractive index tends to be higher in the region located adjacent the outer edge of the substrate. According to the invention, the plasma above the wafer is locally enriched with oxygen to lower the refractive index of that location. As a result, the refractive index of the entire deposited film can be made more uniform across the substrate.

According to the invention, an $SiO_x$ film is grown by the reaction of ions from the plasma, e.g., $O_2^+$, and an adsorbed precursor, e.g., $SiH_x$. An RF bias is applied to the growing film in order to control the properties of the film such as refractive index, stress, composition, and ability to fill small gaps and spaces. When growing such films, RF power applied to the substrate holder is used to create an RF bias on the substrate. However, it has been found that the RF bias results in a fringing field such that the film bias is different at the edge of the substrate than at the center. This difference can result in a variation in the refractive index of the film from the center to the edge. In particular, when forming an $SiO_2$ film, the refractive index of the film tends to be higher at the outer periphery than at the central portion of the substrate.

In general, it is known that the refractive index can be changed by increasing the oxygen flow so that there is an oxygen surplus everywhere on the substrate. This method produces an $SiO_x$ film having a refractive index that approaches the minimum value of 1.455 to 1.460. However, a major disadvantage of such a process is that other properties of the film such as stress, dielectric constant, and hydroxyl content are adversely affected. In addition, since the refractive index range and the film thickness uniformity, in general, are counter parameters when process parameters are chosen to improve one, the other gets worse. Thus, simple addition of excess oxygen to lower the refractive index is not a desirable solution to the problem of films having a non-uniform refractive index.

According to one aspect of the invention, a silicon reactant and an oxygen reactant are introduced into a plasma process chamber and a plasma is generated. The plasma may be generated by a number of methods. For example, the plasma can be generated by various techniques such as ECR wherein the plasma is generated in a plasma generating chamber and the substrate is processed in a reaction chamber adjacent the plasma generating chamber, or by transformer coupled plasma (TCP) or inductively coupled plasma (ICP) techniques wherein the plasma is generated in the same chamber wherein the substrate is processed. After generating the plasma, the plasma is brought into contact with a substrate where an $SiO_x$ film is deposited thereon. The substrate can be any material that is capable of having an $SiO_x$ film formed on it by plasma deposition. For example, the substrate can be a semiconductor substrate, such as a silicon wafer. The substrate can also be made of other materials such as glass used in making a flat panel display. In the case of a semiconductor wafer, the wafer can have various shapes and sizes, e.g., a diameter between about 50 and about 300 mm. For instance, the wafer can have a diameter of about 150 mm or 200 mm.

During the deposition, a second oxygen reactant such as oxygen-containing gas is injected locally into the plasma at the periphery of the substrate. The oxygen-containing gas is preferably pure oxygen. The oxygen can be injected through gas outlets positioned in a deposition shield at a location surrounding the substrate. Preferably, the oxygen is injected through equally spaced-apart gas jets which completely surround the substrate. The oxygen can be introduced at any rate such that the plasma at the periphery of the substrate becomes enriched enough so as to deposit a dielectric film having a refractive index at the periphery of the substrate which is substantially equal to the refractive index at the inner portion of the substrate. The rate of oxygen flow will depend on factors such as substrate dimensions, substrate holder design, silicon reactant flow rate, etc., and for example can range from 5 to 100 sccm. For instance, in the case of a 150 mm silicon wafer, the oxygen flow rate can range from 10 to 25 sccm.

The method according to the present invention produces a substrate containing an $SiO_x$ film having a substantially uniform refractive index from the center to the outer periphery of the substrate. The film is preferably an $SiO_2$ film having a refractive index of about 1.46 to about 1.48.

The apparatus of the present invention includes a substrate support and deposition shield surrounding the substrate support. For instance, the substrate support can be a mechanical clamping or electrostatic clamping apparatus which may be moveable vertically with respect to the shield or vice versa. The deposition shield includes one or more gas injection outlets for supplying the oxygen reactant locally to a region of the plasma adjacent an outer periphery of the substrate.

According to one aspect of the invention, the deposition shield has a plurality of gas injection outlets which are directed toward the periphery of the substrate. The gas injection outlets are circumferentially spaced in a uniform pattern around the substrate and the gas injection outlets are preferably in the form of gas jets.

According to another aspect of the invention, the substrate support is a chuck for retaining the substrate during deposition. The chuck can include a mechanical clamping ring or other suitable arrangement for clamping the substrate, or the chuck can be an electrostatic chucking arrangement. The deposition shield can function to shield reactor components below the shield. The shield includes a series of gas jets arranged in a uniform or non-uniform pattern surrounding the substrate. The jets are preferably equally spaced apart and angled so as to inject gas toward a location overlying the outer periphery of the substrate. The particular angle of the gas jets can be adjusted to compensate for factors such as the velocity of the oxygen gas injected into the plasma, the rate that the plasma is introduced into the reaction chamber, and the size of the substrate.

In a preferred embodiment, the shield includes 16 gas jets equally spaced apart. The jets have outlets which are about 0.7 mm in diameter and the jets are positioned about 1 inch from the edge of a silicon wafer substrate.

FIG. 1 shows half of a cross-section of an apparatus according to one embodiment of the present invention wherein a substrate support 10 such as an electrostatic chuck is surrounded by a shield 11 having a series of gas jets 12 therein for injecting oxygen gas inwardly above a substrate 13. The chuck 10 is designed to hold the substrate 13 during deposition. The chuck can be the same size or nearly the same size as the substrate and can be integral with or independent of the shield 11. Oxygen gas can thus be injected into the plasma at the periphery of the substrate on the chuck through the gas injection outlets of the gas jets 12.

FIG. 2 shows a top view of the apparatus depicted in FIG. 1. As shown, the substrate support 10 is surrounded by the shield 11 which includes eight gas jets 12 for injection of oxygen into the plasma at the periphery of the substrate 13.

Figure 4:
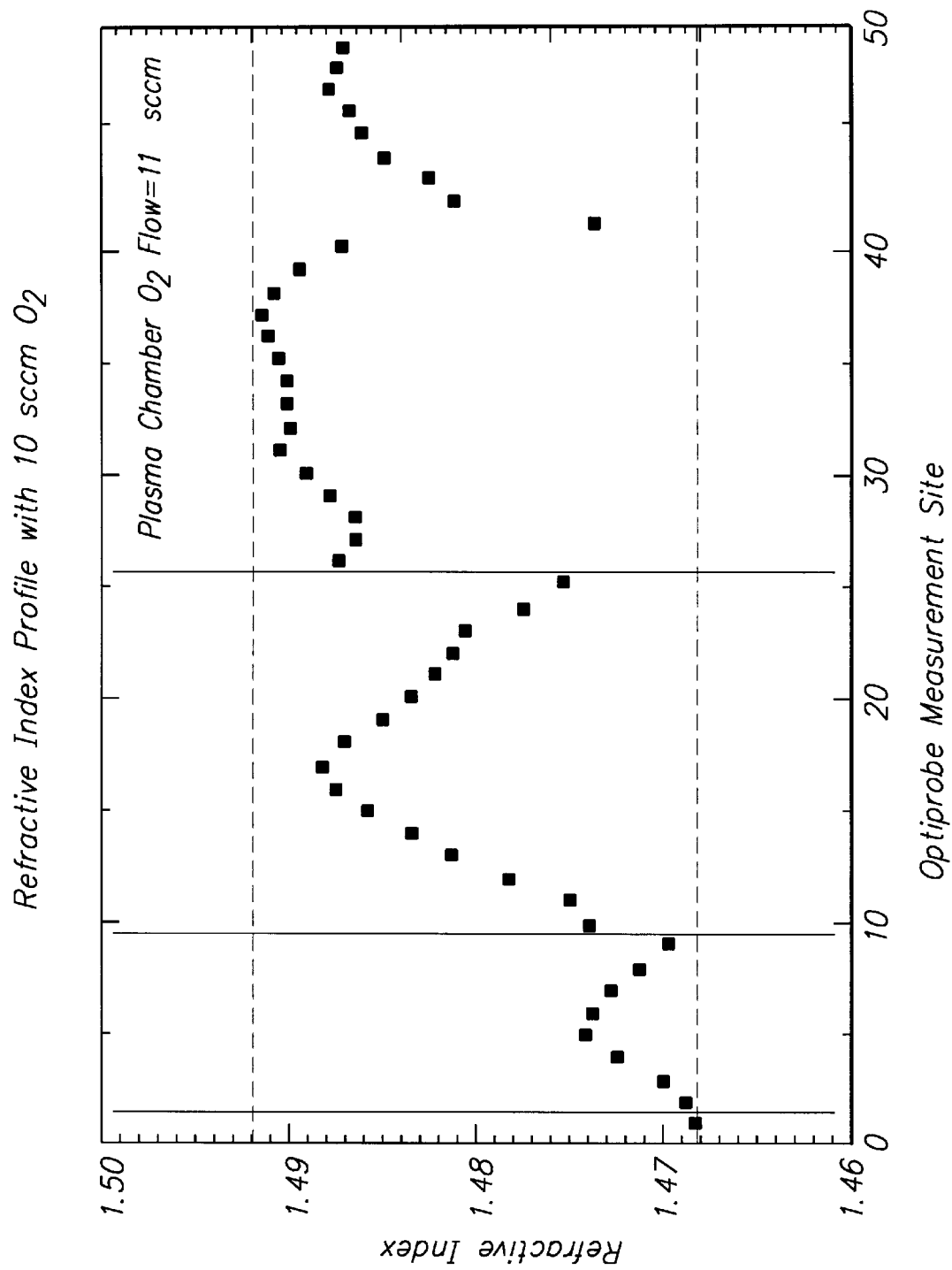
FIG. 4 illustrates the refractive index profile of a film deposited with 10 sccm of $O_2$ flowing through the gas jets.
Figure 5:
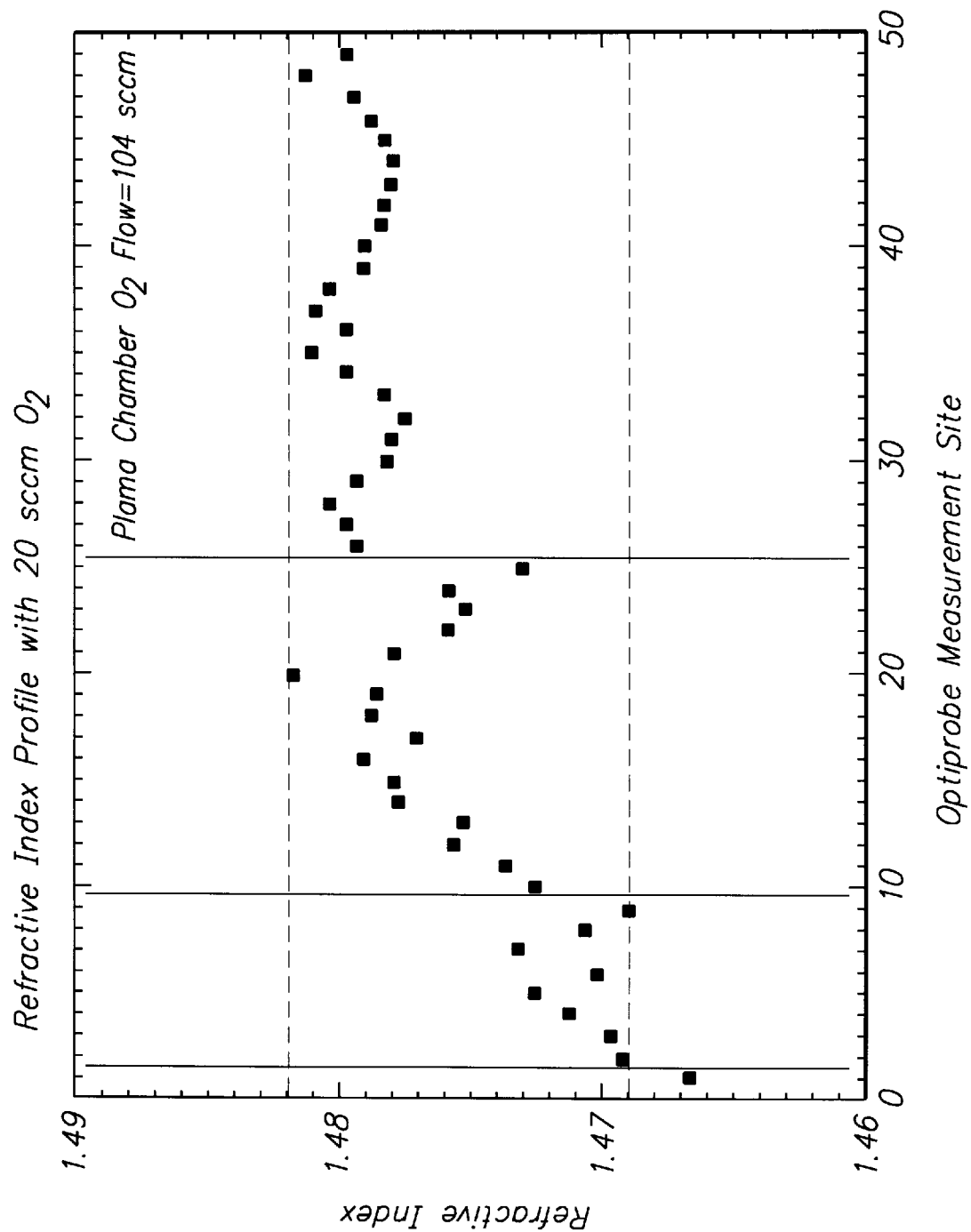
FIG. 5 illustrates the refractive index profile of a film deposited with 20 sccm of $O_2$ flowing through the gas jets.

FIGS. 3, 4, and 5 show refractive index profiles of films deposited with zero, 10, and 20 sccm of oxygen flowing through the gas jets 12, respectively. In depositing the $SiO_x$ film, the flow of oxygen into the main chamber was 112 sccm for the data depicted in FIG. 4 and 104 sccm for the data depicted in FIG. 5. By comparing FIGS. 3, 4, and 5, it can be seen that the disparity in refractive index of the $SiO_x$ film at the inner and outer portions of the wafer is substantially reduced by injecting oxygen into the plasma at the periphery of the substrate. In FIG. 3, the refractive index of the $SiO_x$ film formed with no oxygen flowing through the gas jets 12 ranges from about 1.466 in the inner portion of the substrate to about 1.500 in the outer portion. In FIG. 4 where the oxygen flowing from the gas jets 12 was about 10 sccm, the $SiO_x$ film has a refractive index ranging from about 1.468 in the inner portion to about 1.492 in the outer portion. An even more uniform refractive index can be observed in FIG. 5 wherein the refractive index of the $SiO_x$ film formed with 20 sccm of oxygen flowing through the gas jets 12 ranges from about 1.469 in the inner portion to about 1.482 in the outer portion. Thus, it is possible to substantially decrease the refractive index at the outer periphery of the film on the substrate without substantial change to the refractive index of the film elsewhere on the substrate. As a result, the dielectric film deposited in accordance with the present invention has a substantially uniform refractive index.

The foregoing has described the principles, preferred embodiments, and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method for depositing an $SiO_x$ film on a substrate in a plasma process chamber and improving uniformity of the refractive index of the film, the process comprising steps of:

introducing a first oxygen reactant and a silicon reactant into the plasma process chamber and generating a plasma;

contacting a substrate with the plasma and depositing an $SiO_x$ film on the substrate; and locally injecting a second oxygen reactant into the plasma at a region adjacent the substrate and reducing the refractive index of the film at the region to match the refractive index of the remainder of the film.

2. The method according to claim 1, wherein the substrate is a semiconductor substrate.

3. The method according to claim 1, wherein the substrate is a silicon wafer or a glass substrate of a flat panel display.

4. The method according to claim 1, wherein the first oxygen reactant is $O_2$ and the silicon reactant is $SiH_4$.

5. The method according to claim 4, wherein the plasma is a high density plasma and an RF bias is applied to the substrate during the depositing step.

6. The method according to claim 1, wherein the second oxygen reactant is injected through one or more gas outlets positioned around the substrate.

7. The method according to claim 6, wherein the one or more gas outlets are gas jets.

8. The method according to claim 7, wherein the second oxygen reactant is injected through a plurality of gas jets which are equally spaced around the substrate.

9. The method according to claim 1, wherein the second oxygen reactant is pure oxygen gas.

10. The method according to claim 9, wherein the oxygen gas is injected at a rate of at least about 10 sccm.

11. The method according to claim 10, wherein the oxygen gas is injected at a rate of at least about 20 sccm.

12. The method according to claim 1, wherein the refractive index is substantially uniform across all of the film.

13. The method according to claim 12, wherein the film is an $SiO_2$ film having a refractive index between about 1.46 and about 1.48.

* * * * *